United States Patent
Suezaki et al.

(10) Patent No.: US 6,849,560 B2
(45) Date of Patent: Feb. 1, 2005

(54) METHOD OF DEPOSITING SILICON THIN FILM AND SILICON THIN FILM SOLAR CELL

(75) Inventors: Takashi Suezaki, Otsu (JP); Eiji Kuribe, Neyagawa (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 10/271,473

(22) Filed: Oct. 15, 2002

(65) Prior Publication Data

US 2003/0036216 A1 Feb. 20, 2003

Related U.S. Application Data

(63) Continuation of application No. PCT/JP02/01280, filed on Feb. 15, 2002.

(30) Foreign Application Priority Data

Feb. 15, 2001 (JP) .................................... 2001-038601
Feb. 14, 2002 (JP) .................................... 2002-037223

(51) Int. Cl.$^7$ ............................................. H01L 21/31
(52) U.S. Cl. ...................................................... 438/758
(58) Field of Search ................................ 438/758, 762, 438/764, 767, 788, 458, 776, 777, 779; 118/273 R, 723 MP, 273 MW; 427/255.18, 255.21, 255.27, 255.35, 255.393, 255.33, 255.34; 136/249, 258

(56) References Cited

U.S. PATENT DOCUMENTS 5,364,481 A * 11/1994 Sasaki et al. ............... 118/718
6,250,822 B1 * 6/2001 Wakamiya et al. ......... 396/576

FOREIGN PATENT DOCUMENTS

| EP | 454100 A2 | * 10/1991 | ......... H01L/21/316 |
| EP | 994515 A2 | * 4/2000 | ........... H01L/31/18 |
| EP | 1 089 346 | 4/2001 | |
| JP | 56-40282 | 4/1981 | |
| JP | 56-040282 | 4/1981 | |
| JP | 56040282 A | * 4/1981 | ........... H01L/31/02 |
| JP | 05-166733 | 7/1993 | |
| JP | 05-265033 | 10/1993 | |
| JP | 7-7840 | 1/1995 | |
| JP | 2635950 | 4/1997 | |
| JP | 10-120491 | 5/1998 | |
| JP | 11-186573 | 7/1999 | |
| JP | 200-150944 | 5/2000 | |
| JP | 2000-225547 | 8/2000 | |
| WO | 02/064854 | 8/2002 | |

* cited by examiner

Primary Examiner—George Fourson
Assistant Examiner—Brook Kebede
(74) Attorney, Agent, or Firm—Hogan & Hartson LLP

(57) ABSTRACT

In a method of depositing a silicon thin film by using a vertical plasma CVD apparatus having steps of holding a substrate having an area not smaller than 1,200 cm$^2$ and having a conductive film formed thereon with a substrate holder, disposing the substrate to face an electrode, and depositing a silicon thin film under a power density of 100 mW/cm$^2$ or more, the substrate holder is electrically insulated from the conductive film formed on the surface of the substrate by forming a separation groove in the conductive film.

5 Claims, 3 Drawing Sheets

METHOD OF DEPOSITING SILICON THIN FILM AND SILICON THIN FILM SOLAR CELL

CROSS REFERENCE TO RELATED APPLICATIONS

This is a Continuation Application of PCT Application No. PCT/JP02/01280, filed Feb. 15, 2002, which was not published under PCT Article 21(2) in English.

This application is based upon and claims the benefit of priority from the prior Japanese Patent Applications No. 2001-038601, filed Feb. 15, 2001; and No. 2002-037223, filed Feb. 14, 2002, the entire contents of both of which are incorporated herein by reference.

BACKGROUND OF THE INVENTION

1. Field of the Invention

The present invention relates to a method of depositing a silicon thin film used in, for example, a thin film solar cell and to a silicon thin film solar cell.

2. Description of the Related Art

A thin film solar cell module is constructed such that string-like solar cells each consisting of a transparent electrode layer, a photovoltaic semiconductor layer, and a back electrode layer, which are stacked one upon the other on a transparent substrate, are connected in series. The photovoltaic semiconductor layer formed of amorphous silicon is low in cost, but is defective in that the photovoltaic efficiency is low. In order to improve the photovoltaic efficiency, it is advantageous to use a hybrid type photovoltaic semiconductor layer in which pin-type amorphous silicon and pin-type polycrystalline silicon (polysilicon) layer are stacked one upon the other or a polysilicon type photovoltaic semiconductor layer using pin-type polysilicon alone. Also, a substrate having a large area has come to be used for improving the manufacturing efficiency of the thin film solar cell module.

In order to deposit a photovoltaic layer on a transparent electrode layer formed on a transparent substrate having a large area, it is efficient to use vertical-type in-line plasma CVD apparatus. The method of depositing a photovoltaic semiconductor layer by using vertical-type in-line plasma CVD apparatus will now be described with reference to FIGS. 1A and 1B. As shown in FIG. 1A, a frame-like substrate holder 1 is constructed to have a recess, slightly larger than a substrate 2, on the back surface. The substrate holder 1 is first placed horizontally, and the substrate 2 is fitted into the recess of the substrate holder 1 from the backside under the state that the transparent conductive film is positioned on the front side. As shown in FIG. 1B, a back plate 3 is put on the back surface of the substrate holder 1, and pins are slid between fixing tools 1a of the substrate holder 1 and fixing tools 3a of the back plate 3 so as to hold the substrate 2. The substrate holder 1 holding the substrate 2 under the particular state is held upright and moved within the vertical-type in-line plasma CVD apparatus to the position of an electrode 4. Under this condition, a photovoltaic semiconductor layer is deposited by plasma CVD. Incidentally, a conductive material such as SUS is used for the substrate holder 1 in view of the mechanical strength required for holding the substrate having a large area.

FIG. 2 shows in a magnified fashion the contact portion between the substrate holder 1 and the substrate in the process of depositing a photovoltaic semiconductor layer by the conventional method. As shown in FIG. 2, a transparent conductive film 22 is formed on a transparent substrate 21, and the peripheral region of the transparent conductive film 22 is in contact with the inner edge portion of the substrate holder 1.

No problem was generated in the case of depositing an amorphous silicon film by plasma CVD under the state shown in FIG. 2. However, in the case of depositing a polysilicon film, abnormal distribution or defects have been generated in the thin film. In the worst case, it has been found that the substrate is cracked. It has been clarified that the difficulty is caused as follows.

Amorphous silicon has a relatively high absorption coefficient and, thus, the thickness of the amorphous silicon film can be decreased. In the case of a polysilicon film, however, it is necessary to increase the thickness of the film because polysilicon has a low absorption coefficient. In order to improve the productive efficiency by shortening the time required for depositing the polysilicon layer, it is necessary to supply high power to the substrate so as to increase the film deposition rate. To be more specific, for depositing a polysilicon layer, the power density on the substrate is set at a high level not lower than 100 mW/cm$^2$. The power density noted above is at least 4 to 6 times as high as the power density for depositing an amorphous silicon layer. If plasma CVD is performed under a power density not lower than 100 mW/cm$^2$ under the state that the transparent conductive film 22 formed on the surface of the substrate 21 is brought into contact with the substrate holder 1 as shown in FIG. 2, problems are generated such as blackish discoloring of the transparent conductive film, defects such as flaws and scrapes, and a substrate crack. These defects are rendered prominent with increase in the supplied power. It is considered reasonable to understand that a charge is accumulated in the transparent conductive film 22 in performing the plasma CVD so as to bring about abnormal discharge (a spark) between the tip of the substrate holder 1 and the transparent conductive film 22, leading to the defects referred to above.

If the substrate holder 1 could be brought into a tight contact with the transparent conductive film 22, it would be theoretically possible to release the charge accumulated on the surface of the transparent conductive film 22 through the substrate holder 1 so as to overcome the difficulty noted above. However, it is practically impossible to bring the substrate holder 1 into a tight contact with the transparent conductive film 22 because of, for example, the warp of the substrate 21.

An object of the present invention is to provide a method of depositing a silicon thin film on a substrate having a large area under a high power density by using vertical-type plasma CVD apparatus, which permits improving uniformity of the silicon thin film and also permits preventing a substrate crack so as to realize stable production.

BRIEF SUMMARY OF THE INVENTION

The present invention provides a method of depositing a silicon thin film by using a plasma CVD apparatus, comprising: holding a substrate having an area not smaller than 1,200 cm$^2$ and having a conductive film formed thereon with a substrate holder; disposing the substrate to face an electrode; and depositing a silicon thin film under a power density of 100 mW/cm$^2$ or more, preferably 200 mW/cm$^2$ or more in view of the production efficiency, wherein the substrate holder is electrically insulated from the conductive film formed on the substrate.

The present invention also provides a silicon thin film solar cell, comprising a conductive film formed on a surface of a rectangular substrate, wherein at least one separation groove formed in the conductive film along each of the four sides of the substrate in a region within 3 mm to 40 mm from the outer periphery of the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

In the method of the present invention, the substrate holder is electrically insulated from the conductive film formed on the surface of the substrate. Therefore, it is possible to prevent abnormal discharge between the substrate holder and the conductive film formed on the surface of the substrate in depositing a silicon thin film on the substrate having a large area not smaller than 1,200 cm$^2$ under a power density set at a high value not lower than 100 mW/cm$^2$. As a result, uniformity of the silicon thin film can be improved and a substrate crack can be prevented.

In the present invention, the substrate holder is insulated from the substrate so as to suppress the generation of abnormal discharge in the contact portion between the two members. The abnormal discharge is considered to take place in the case where a considerably large amount of electric charge is accumulated when the charge accumulated on the conductive film escapes to the substrate holder. Since the accumulated charge tends to escape through the contact portion between the substrate and the substrate holder, the amount of the electric charge that escapes at once to the substrate holder is dependent on the ratio of the substrate area over the peripheral length of the substrate, taking into account of the construction of the substrate holder used in the present invention. Since the particular ratio is proportional to the square of the substrate size, the abnormal discharge tends to take place easily with increase in the substrate area. Such being the situation, the method of the present invention is rendered indispensable in the case where a silicon thin film is formed on a substrate having a large area under high power.

The specific methods for electrically insulating the substrate holder from the conductive film formed on the surface of the substrate in the present invention will now be described with reference to the accompanying drawings.

Figure 3:
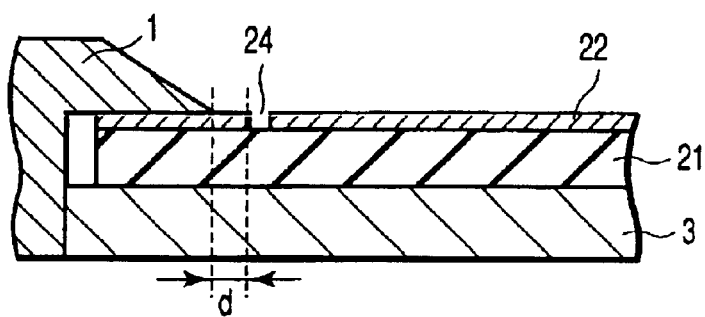
FIG. 3 is a cross sectional view showing the contact state between the substrate holder and the substrate in a method according to one embodiment of the present invention.

For example, a substrate holder 1 is electrically insulated from a transparent conductive film 22 by forming a separation groove 24 in the transparent conductive film 22 formed on the surface of a substrate 21, as shown in FIG. 3. The separation groove 24 is formed away from the inner edge of the substrate holder 1 by a distance d of 0.1 to 30 mm. It is more desirable for the distance d between the inner edge of the substrate holder 1 and the separation groove 24 to fall within a range of between 1 mm and 30 mm. Where the distance d is smaller than 0.1 mm, it is difficult to prevent the abnormal discharge. In addition, it is difficult to ensure a desired distance d because of the positional deviation of the substrate. On the other hand, if the distance d exceeds 30 mm, the utilization ratio of the solar cell on the substrate is lowered. Also, in order to improve insulating reliability or in order to supply higher power, it is desirable to form two or three separation grooves, which are 0.5 mm to 2 mm away from each other, in the region where the distance d falls within a range of between 1 mm and 30 mm. If the number of separation grooves is three or less, the tact time for performing laser scribing to the transparent conductive film is relatively short, which is practical in terms of productivity.

Also, it is desirable for the width of the overlapping portion between the substrate holder and the substrate to be at least 3 mm for supporting the substrate without fail. On the other hand, it is desirable for the width noted above to be not larger than 10 mm because, if the width in question is excessively large, the effective area of the semiconductor layer is decreased. It follows that, in actually forming the separation groove in the transparent electrode formed on the substrate, it is desirable to form the separation groove in a region that is 3 mm to 40 mm away from the outer periphery of the substrate. It is also desirable to form at least one separation groove along each of the four outer sides of the rectangular substrate.

Figure 4:
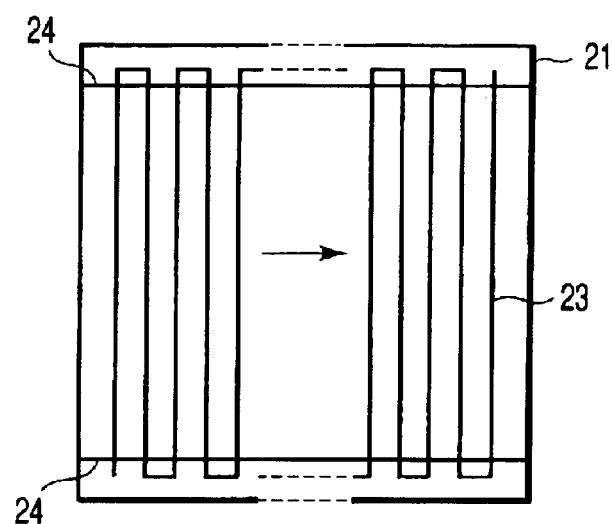
FIG. 4 is a plan view showing the separation groove shown in FIG. 3.

The separation groove 24 will now be described with reference to FIG. 4. As shown in FIG. 4, in order to form string-like solar cells, a scribing line 23 is formed zigzag on the transparent conductive film 22 on the surface of the substrate 21 by using a laser scriber before deposition of a photovoltaic semiconductor layer. Further, two separation grooves 24 are formed by laser scribing in the vicinity of the two sides parallel to the integration direction of the solar cells denoted by an arrow in the drawing. These two separation grooves are formed inside the portion where the scribing lines 23 are connected with each other so as to separate the transparent conductive film 22 into the peripheral region and the cell-integrated region. If the separation grooves 24 are formed in this fashion, the transparent conductive film 22 is separated into the peripheral region and the cell-integrated region naturally by the scribing lines 23 in the front and rear of the integration direction of the solar cells. A photovoltaic semiconductor layer is deposited under this condition.

Incidentally, Jpn. Pat. Appln. KOKAI Publication No. 11-186573 teaches the idea that a photovoltaic semiconductor layer is deposited after formation of a peripheral separation groove in a transparent electrode layer. However, the method proposed in this prior art is intended to ensure sufficient insulation between the cell-integrated region and the peripheral region in the final product. This prior art does not teach the technical idea of the present invention that abnormal discharge is prevented in depositing a silicon thin film on a substrate having a large area under a high power density by using vertical-type plasma CVD apparatus.

Figure 5:
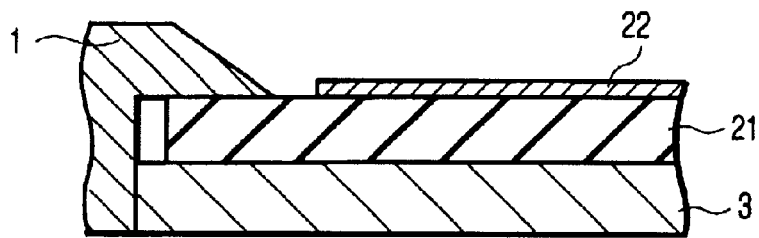
FIG. 5 is a cross sectional view showing the contact state between the substrate holder and the substrate in a method according to another embodiment of the present invention.

It is also possible to employ the method shown in FIG. 5. Specifically, the transparent conductive film 22 is removed in the peripheral region of the substrate 21, and the substrate holder 1 is electrically insulated from the transparent conductive film 22 by bringing the substrate holder 1 into contact with the peripheral region of the substrate 21 having the transparent conductive film 22 removed therefrom so as to permit the substrate 21 to be held by the substrate holder 1.

Incidentally, Japanese Patent Disclosure No. 2000-225547 discloses a method of mechanically removing a transparent conductive film by a prescribed width from the outer peripheral region of the substrate. This method is intended to perform sufficient processing of an insulating separation between the cell-integrated region and the peripheral region in a short time. However, this prior art does not teach the object of the present invention that abnormal discharge is prevented in depositing a silicon thin film on a substrate having a large area under a high power density by using vertical-type plasma CVD apparatus.

Figure 6:
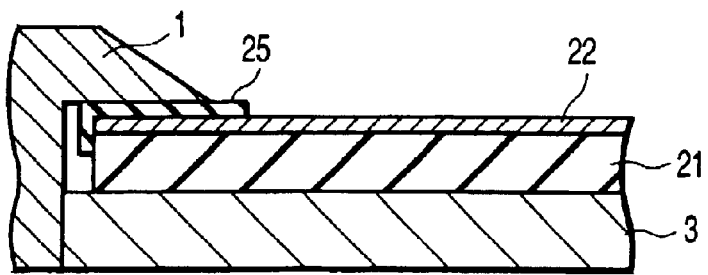
FIG. 6 is a cross sectional view showing the contact state between the substrate holder and the substrate in a method according to another embodiment of the present invention.

It is also possible to electrically insulate the substrate holder 1 from the transparent conductive film 22 by arranging an insulator between the transparent conductive film 22 formed on the surface of the substrate 21 and the substrate holder 1, as shown in FIG. 6. It is possible to use, as the insulator, an insulating tape 25 such as a polyimide tape low in degassing. It is also possible to use, as the insulator, an insulating coating prepared by, for example, thermally spraying anodized aluminum to the surface of the substrate holder 1 in a thickness of, for example, about 100 μm.

Incidentally, Japanese Patent Disclosure No. 56-40282 discloses a method of depositing an amorphous silicon film by plasma CVD, with an insulating spacer interposed between an oxide transparent electrode formed on the surface of the substrate and the substrate holder for holding the substrate. However, this prior art is intended to prevent the oxide transparent electrode from being brought into contact with the substrate holder. If the oxide transparent electrode is brought into contact with the substrate holder, it is grounded and, thus, is reduced into a metal under a reducing atmosphere, thereby losing the transparency. This prior art also does not teach the object of the present invention that abnormal discharge is prevented in depositing a silicon thin film on a substrate having a large area under a high power density by using vertical-type plasma CVD apparatus.

Figure 7:
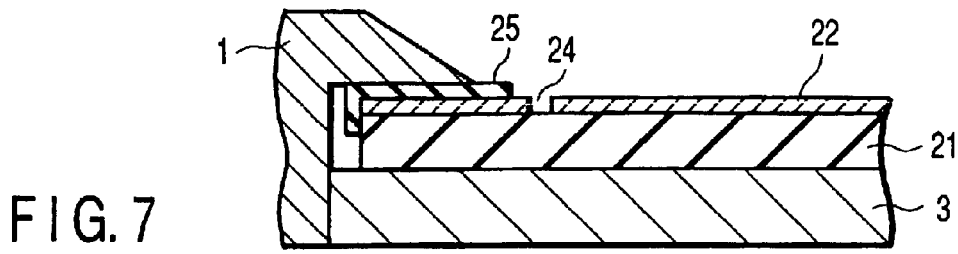
FIG. 7 is a cross sectional view showing the contact state between the substrate holder and the substrate in a method according to another embodiment of the present invention.

Further, it is possible in the present invention to employ the method of electrically insulating the substrate holder 1 from the transparent conductive film 22 as shown in FIG. 7. To be more specific, the separation groove 24 is formed on the transparent conductive film 22 formed on the surface of the substrate 21 in a position which is 0.1 to 30 mm away from the inner edge of the substrate holder 1, and the insulating tape 25 is arranged between the transparent conductive film 22 formed on the surface of the substrate 21 and the substrate holder 1, thereby electrically insulating the substrate holder 1 from the transparent conductive film 22. Likewise, it is also possible to employ the method shown in FIG. 8. Specifically, the separation groove 24 is formed on the transparent conductive film 22 formed on the surface of the substrate 21 in a position which is 0.1 to 30 mm away from the inner edge of the substrate holder 1, and the insulating coating 26 is arranged on the contact portion of the substrate holder 1 with the substrate 21, thereby electrically insulating the substrate holder 1 from the transparent conductive film 22.

Figure 8:
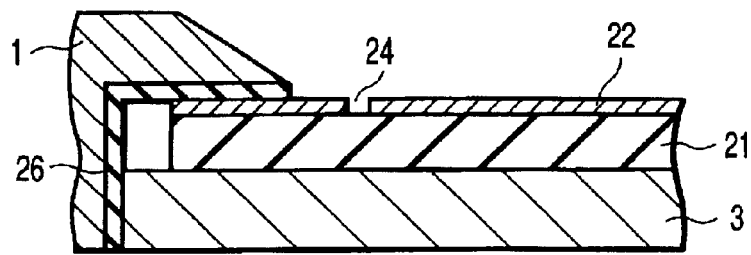
FIG. 8 is a cross sectional view showing the contact state between the substrate holder and the substrate in a method according to another embodiment of the present invention.

The methods shown in FIGS. 7 and 8 are most effective for electrically insulating the substrate holder 1 from the transparent conductive film 22. In these methods, it is possible to prevent effectively abnormal discharge between the tip of the substrate holder 1 and the transparent conductive film 22 even in the case where the power density on the surface of the substrate 21 is very high.

EXAMPLE 1

A glass substrate sized at 910 mm×910 mm and having a transparent conductive film formed on the surface thereof was prepared. As shown in FIGS. 3 and 4, a separation groove 24 was formed in a width of about 100 μm by laser scribing in the transparent conductive film 22 formed on the surface of the glass substrate 21 such that the separation groove 24 was positioned 3 mm away from the inner edge of the substrate holder 1 when the glass substrate 21 was mounted to the substrate holder 1.

Figure 9:
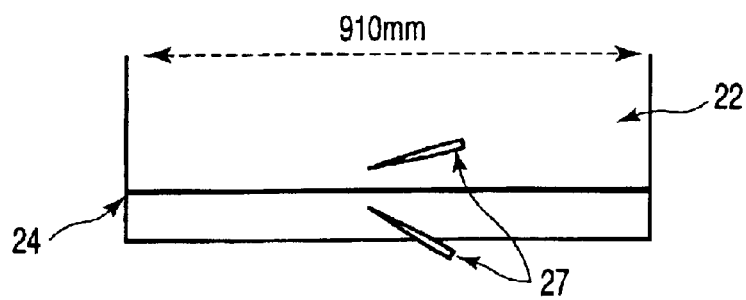
FIG. 9 schematically shows the method of measuring insulating properties in the present invention.

As shown in FIG. 9, the probes 27 of Megatester were brought into contact with the transparent conductive film 22 such that the probes 27 were positioned away from each other by a distance of about 8 mm with locating the separation groove 24 between the probes. When a voltage of 250 V was applied, it was possible to obtain insulation not lower than 0.5 MΩ.

Figure 1A:
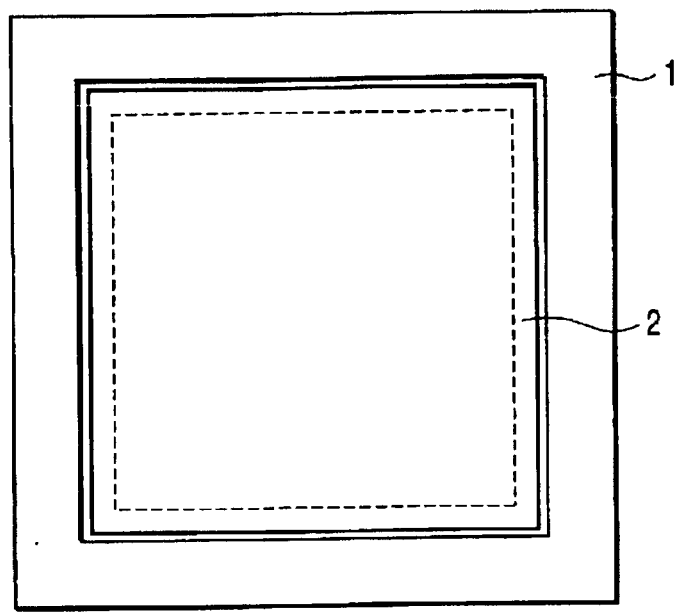
FIGS. 1A and 1B are a plan view and a cross sectional view, respectively, collectively showing the mounted state of a substrate to a substrate holder.
Figure 1B:
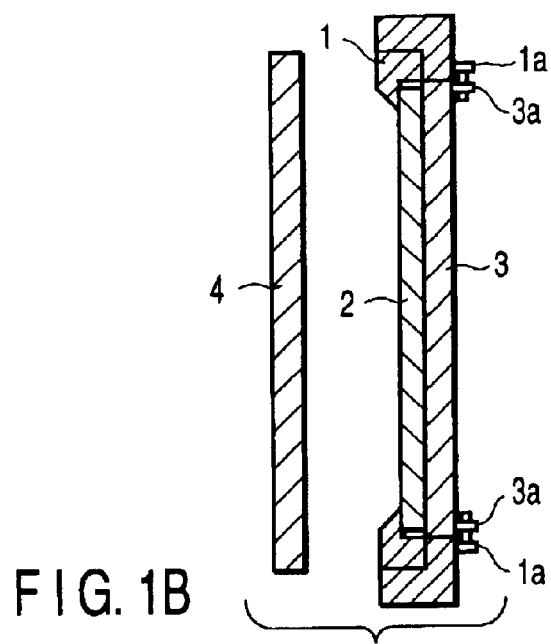
Figure 2:
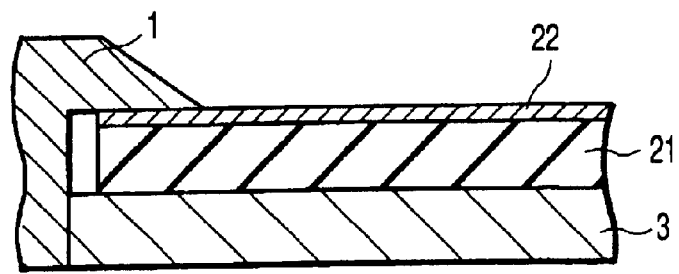
FIG. 2 is a cross sectional view showing the contact state between the substrate holder and the substrate in the conventional method.

As shown in FIG. 1, a single glass substrate 21 of the size referred to above was held with the substrate holder 1 of vertical-type in-line plasma CVD apparatus. In this case, the distance between the inner edge of the substrate holder 1 and the separation groove 24 falls within a range of 3±2 mm in view of the positional deviation of the glass substrate 21. The substrate holder 1 holding the glass substrate 21 was moved to the position where the electrode 4 sized at 115 cm×118 cm was arranged, and a hydrogen gas and a silane gas were introduced as reactant gases. Under this condition, a polysilicon film was deposited by supplying electric power of 3 kW. Under these conditions, the power density on the surface of the substrate is about 221 mW/cm$^2$. As a result, no defect of the film caused by abnormal discharge was observed in the polysilicon film thus deposited. No substrate crack was generated either.

Then, another polysilicon film was deposited under the conditions exactly equal to those described above, except that electric power of 5 kW (power density of about 368 mW/cm$^2$) or 8 kW (power density of about 590 mW/cm$^2$) was supplied in depositing the polysilicon film. No defect of the film caused by abnormal discharge was observed in the polysilicon film thus deposited in each of these cases. No substrate crack was generated either.

Abnormal discharge was not observed either in the case where the separation groove 24 formed by laser scribing had a width of about 40 μm or about 200 μm.

COMPARATIVE EXAMPLE 1

A polysilicon film was deposited under the conditions as described in Example 1, except that the separation groove 24 was not formed in the transparent conductive film 22 formed on the surface of the glass substrate 21. In this case, defects of the film caused by abnormal discharge were observed in the polysilicon film deposited under the power supply of any of 3 kW and 5 kW. Also, a substrate crack was generated in some of the samples.

EXAMPLE 2

A glass substrate sized at 910 mm×455 mm and having a transparent conductive film formed on the surface thereof was prepared. Then, a separation groove 24 was formed in a width of about 100 μm by laser scribing in the transparent conductive film 22 formed on the surface of the glass substrate 21 such that the separation groove 24 was positioned 3 mm away from the inner edge of the substrate holder 1 when the glass substrate 21 was mounted to the substrate holder 1, as in Example 1.

Two glass substrates 21 of the size described above were mounted to the substrate holder 1 of vertical-type in-line plasma CVD apparatus. In this case, another substrate holder 1 was also arranged intermediate between the two glass substrates 21. Then, a polysilicon film was deposited by supplying electric power of 3 kW or 5 kW as in Example 1. As a result, no defect derived from abnormal discharge was observed in the polysilicon film deposited under any condition. Also, no substrate crack was generated.

EXAMPLE 3

A glass substrate sized at 400 mm×300 mm and having a transparent conductive film formed on the surface thereof was prepared. Then, a separation groove 24 was formed in a width of about 100 μm by laser scribing in the transparent conductive film 22 formed on the surface of the glass substrate 21 such that the separation groove 24 was positioned 3 mm away from the inner edge of the substrate holder 1 when the glass substrate 21 was mounted to the substrate holder 1, as in Example 1. Further, a polysilicon film was deposited by supplying electric power of 3 kW or 5 kW as in Example 1. As a result, no defect derived from abnormal discharge was observed in the polysilicon film deposited under any condition. Also, no substrate crack was generated.

EXAMPLE 4

A glass substrate sized at 910 mm×910 mm and having a transparent conductive film formed on the surface thereof was prepared. As shown in FIG. 5, the transparent conductive film 22 was removed by polishing in the region of at least 5 mm from the edge of the substrate 21, in place of forming the separation groove 24. Then, a polysilicon film was deposited by supplying electric power of 3 kW or 5 kW as in Example 1. As a result, no defect derived from abnormal discharge was observed in the polysilicon film deposited under any condition. Also, no substrate crack was generated.

EXAMPLE 5

A glass substrate sized at 910 mm×910 mm and having a transparent conductive film formed on the surface thereof was prepared. As shown in FIG. 6, an insulating tape 25 made of polyimide was arranged between the transparent conductive film 22 formed on the surface of the substrate 21 and the substrate holder 1, in place of forming the separation groove 24. Then, a polysilicon film was deposited by supplying electric power of 3 kW or 5 kW as in Example 1. As a result, no defect derived from abnormal discharge was observed in the polysilicon film deposited under any condition. Also, no substrate crack was generated.

EXAMPLE 6

A glass substrate sized at 910 mm×910 mm and having a transparent conductive film formed on the surface thereof was prepared. As shown in FIG. 8, a separation groove 24 was formed in the transparent conductive film 22, and an insulating coating 26 having a thickness of about 100 μm was formed by thermal spraying of anodized aluminum in the contact portion between the substrate holder 1 and the glass substrate. Then, a polysilicon film was deposited by supplying electric power of 3 kW, 5 kW or 8 kW (power density of about 590 mW/cm$^2$) as in Example 1. As a result, no defect derived from abnormal discharge was observed in the polysilicon film deposited under any condition. Also, no substrate crack was generated.

EXAMPLE 7

A glass substrate sized at 910 mm×910 mm and having a transparent conductive film formed on the surface thereof was prepared. As shown in FIG. 7, a separation groove 24 was formed in the transparent conductive film 22, and an insulating tape made of polyimide was arranged between the transparent conductive film 22 formed on the surface of the substrate 21 and the substrate holder 1. Then, a polysilicon film was deposited by supplying electric power of 8 kW (power density of about 590 mW/cm$^2$) as in Example 1. As a result, no defect derived from abnormal discharge was observed in the polysilicon film. Also, no substrate crack was generated.

EXAMPLE 8

Figure 10:
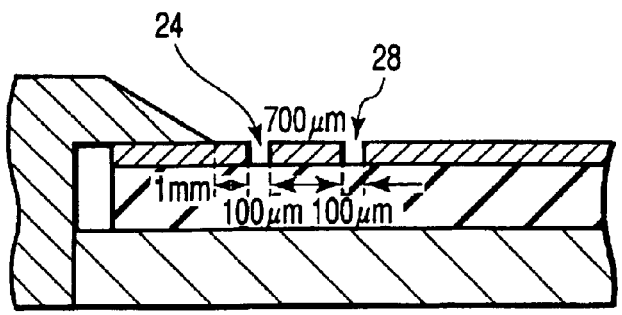
FIG. 10 is a cross sectional view showing the contact state between the substrate holder and the substrate in a method according to another embodiment of the present invention.

A glass substrate sized at 910 mm×910 mm and having a transparent conductive film formed on the surface thereof was prepared. As shown in FIG. 10, a first separation groove 24 was formed in a width of about 100 μm by laser scribing in the transparent conductive film 22 formed on the surface of the glass substrate 21 such that the first separation groove 24 was positioned about 1 mm away from the inner edge of the substrate holder 1 when the glass substrate 21 was mounted to the substrate holder 1. Also, a second separation groove 28 was formed in a width of about 100 μm by laser scribing such that the second separation groove 28 was positioned on the inner region of the glass substrate than the first separation groove 24 and away from the first separation groove 24 by about 0.7 mm.

As in Example 1, the probes of Megatester were brought into contact with the transparent conductive film 22 such that the probes were positioned away from each other by a distance of about 8 mm with locating the first and second separation grooves 24 and 28 between the probes. When a voltage of 250 V was applied, it was possible to obtain insulation not lower than 0.5 MΩ.

A polysilicon film was deposited by supplying electric power of 3 kW or 5 kW as in Example 1. No defect derived from abnormal discharge was observed in the polysilicon film deposited under any condition. Also, no substrate crack was generated. Further, no defect derived from abnormal discharge was observed in the polysilicon film deposited by supplying electric power of 8 kW.

Next, the distance between the first separation groove 24 and the second separation groove 28 was set at about 0.5 mm or about 2 mm. When a voltage of 250 V was applied by using Megatester, insulation not lower than 0.5 MΩ was obtained in each of these cases. Further, no defect derived from abnormal discharge was observed in the polysilicon film deposited by supplying electric power of 3 kW, 5 kW or 8 kW.

Still further, abnormal discharge was not generated also in the case where the width of each of the separation grooves 24, 28 formed by laser scribing was set at about 40 μm or about 200 μm.

EXAMPLE 9

Figure 11:
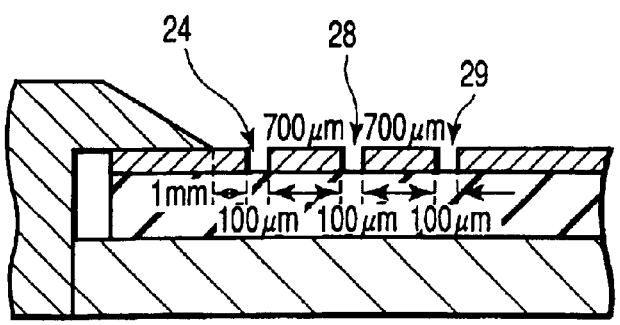
FIG. 11 is a cross sectional view showing the contact state between the substrate holder and the substrate in a method according to still another embodiment of the present invention.

A glass substrate sized at 910 mm×910 mm and having a transparent conductive film formed on the surface thereof was prepared. As shown in FIG. 11, a first separation groove 24 was formed in a width of about 100 μm by laser scribing in the transparent conductive film 22 formed on the surface of the glass substrate 21 such that the first separation groove 24 was positioned about 1 mm away from the inner edge of the substrate holder 1 when the glass substrate 21 was mounted to the substrate holder 1. Also, a second separation groove 28 was formed in a width of about 100 μm by laser scribing such that the second separation groove 28 was positioned on the inner region of the glass substrate than the first separation groove 24 and away from the first separation groove 24 by about 0.7 mm. Further, a third separation groove 29 was formed in a width of about 100 μm by laser scribing such that the third separation groove 29 was positioned on the inner region of the glass substrate than the second separation groove 28 and away from the second separation groove 28 by about 0.7 mm.

As in Example 1, the probes of Megatester were brought into contact with the transparent conductive film 22 such that the probes were positioned away from each other by a distance of about 8 mm with locating the first to third separation grooves 24, 28 and 29 between the probes. When a voltage of 250 V was applied, it was possible to obtain insulation not lower than 0.5 MΩ.

A polysilicon film was deposited by supplying electric power of 3 kW, 5 kW or 8 kW as in Example 1. No defect derived from abnormal discharge was observed in the polysilicon film deposited under any condition.

Next, each of the distance between the first separation groove 24 and the second separation groove 28 and the distance between the second separation groove 28 and the third separation groove 29 was set at about 0.5 mm or about 2 mm. When a voltage of 250 V was applied by using Megatester, insulation not lower than 0.5 MΩ was obtained in each of these cases. Further, no defect derived from abnormal discharge was observed in the polysilicon film deposited by supplying electric power of 3 kW, 5 kW or 8 kW.

Still further, insulation not lower than 0.5 MΩ was obtained also in the case where the width of each of the separation grooves 24, 28 and 29 formed by laser scribing was set at about 40 μm or about 200 μm. Also, no defect derived from abnormal discharge was observed in the polysilicon film deposited by supplying electric power of 3 kW, 5 kW or 8 kW.

Incidentally, in the examples shown in FIGS. 10 and 11, separation grooves were formed successively such that a separation groove was formed first in the outer region of the substrate and, then, another separation groove was formed in the inner region of the substrate. Alternatively, it is also possible to form separation grooves such that a separation groove is formed first in the inner region of the substrate and, then, another separation groove is formed in the outer region of the substrate.

In the case of employing the method of the present invention, it is possible to improve uniformity of a silicon thin film in depositing the silicon thin film on a substrate having a large area under a high power density by using vertical-type plasma CVD apparatus. It is also possible to prevent a substrate crack so as to realize stable production.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of depositing a silicon thin film on a substrate by using a plasma CVD apparatus, comprising: holding the substrate having an area not smaller than 1,200 cm$^2$ and having a conductive film formed thereon with a substrate holder; disposing the substrate to face an electrode; and depositing a silicon thin film on the substrate under a power density of 100 mW/cm$^2$ or more, wherein the conductive film is removed from a peripheral region of the substrate, and the substrate holder is brought into contact with the peripheral region of the substrate from which the conductive film is removed so as to permit the substrate holder to hold the substrate, wherein the substrate holder is electrically insulated from the conductive film formed on the surface of the substrate.

2. A method of depositing a silicon thin film on a substrate by using a plasma CVD apparatus, comprising: holding the substrate having an area not smaller than 1,200 cm$^2$ and having a conductive film formed thereon with a substrate holder; disposing the substrate to face an electrode; and depositing a silicon thin film on the substrate under a power density of 100 mW/cm$^2$ or more, wherein the substrate holder is electrically insulated from the conductive film formed on the surface of the substrate, wherein a separation groove is formed in the conductive film formed on the surface of the substrate such that the separation groove is positioned away from the inner edge of the substrate holder by 0.1 to 30 mm.

3. A method of depositing a silicon thin film on a substrate by using a plasma CVD apparatus, comprising: holding the substrate having an area not smaller than 1,200 cm$^2$ and having a conductive film formed thereon with a substrate holder; disposing the substrate to face an electrode; and depositing a silicon thin film on the substrate under a power density of 100 mW/cm$^2$ or more, wherein the substrate holder is electrically insulated from the conductive film formed on the surface of the substrate, wherein a separation groove is formed in the conductive film formed on the surface of the substrate such that the separation groove is positioned away from the inner edge of the substrate holder by 0.1 to 30 mm, and an insulator is arranged between the conductive film deposited on the surface of the substrate and the substrate holder.

4. A method of depositing a silicon thin film on a substrate by using a plasma CVD apparatus, comprising: holding the substrate having an area not smaller than 1,200 cm$^2$ and having a conductive film formed thereon with a substrate holder; disposing the substrate to face an electrode; and depositing a silicon thin film on the substrate under a power density of 100 mW/cm$^2$ or more, wherein the substrate holder is electrically insulated from the conductive film formed on the surface of the substrate, wherein a first separation groove is formed in the conductive film formed on the surface of the substrate such that the first separation groove is positioned away from the inner edge of the substrate holder by 0.1 to 30 mm, and a second separation groove is formed in a region within 30 mm from the inner edge of the substrate holder and away from the edge of the first separation groove by 0.5 mm to 2 mm.

5. A method of depositing a silicon thin film on a substrate by using a plasma CVD apparatus, comprising: holding the substrate having an area not smaller than 1,200 cm$^2$ and having a conductive film formed thereon with a substrate holder; disposing the substrate to face an electrode; and depositing a silicon thin film on the substrate under a lower density of 100 mW/cm$^2$ or more, wherein the substrate holder is electrically insulated from the conductive film formed on the surface of the substrate, wherein a first separation groove is formed in the conductive film formed on the surface of the substrate such that the first separation groove is positioned away from the inner edge of the substrate holder by 0.1 to 30 mm, a second separation groove is formed in a region within 30 mm the inner edge of the substrate holder and away from the edge of the first separation groove by 0.5 mm to 2 mm, and a third separation groove is formed in a region within 30 mm from the inner edge of the substrate holder and away from the edge of the second separation groove by 0.5 mm to 2 mm.

* * * * *